United States Patent
Kang (10) Patent No.: US 8,659,462 B2
(45) Date of Patent: Feb. 25, 2014

(54) SUCCESSIVE APPROXIMATION REGISTER ANALOG-TO-DIGITAL CONVERTER AND ANALOG-TO-DIGITAL CONVERSION METHOD USING THE SAME

(75) Inventor: Hyeong-Won Kang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 99 days.

(21) Appl. No.: 13/314,720

(22) Filed: Dec. 8, 2011

(65) Prior Publication Data

US 2012/0146822 A1     Jun. 14, 2012

(30) Foreign Application Priority Data

Dec. 10, 2010 (KR) .................. 10-2010-0126553
Nov. 17, 2011 (KR) .................. 10-2011-0119910

(51) Int. Cl.
*H03M 1/34* (2006.01)

(52) U.S. Cl.
USPC ........................ 341/163; 341/155; 341/172

(58) Field of Classification Search
USPC ................................. 341/163, 172
See application file for complete search history.

(56) References Cited

U.S. PATENT DOCUMENTS

| | | | | | |
|---|---|---|---|---|---|
| 4,388,612 | A | * | 6/1983 | Takagi et al. | 341/145 |
| 4,594,576 | A | * | 6/1986 | Fujii | 341/138 |
| 4,665,382 | A | * | 5/1987 | Morgan | 341/122 |
| 4,777,470 | A | * | 10/1988 | Naylor et al. | 341/163 |
| 5,859,608 | A | * | 1/1999 | Fucili et al. | 341/165 |
| 6,118,400 | A | * | 9/2000 | Susak | 341/172 |
| 6,154,163 | A | * | 11/2000 | Rossi et al. | 341/161 |

* cited by examiner

*Primary Examiner* — Khai M Nguyen
(74) *Attorney, Agent, or Firm* — Brinks, Gilson & Lione (57) ABSTRACT

A Successive Approximation Register (SAR) Analog-to-Digital Converter (ADC) includes a Sample-and-Hold Amplifier (SHA) for sampling and holding an externally input analog voltage, a comparator for comparing a level of the sampled and held analog voltage with a level of an analog signal corresponding to n bits and generating a comparison signal according to result of comparison, an SAR logic circuit for sequentially generating a digital signal from a Most significant Bit (MSB) to a Least Significant Bit (LSB) in response to the comparison signal, a Digital-to-Analog Converter (DAC) for providing the analog signal to the comparator, and an output register for holding the sequentially generated digital signal from the MSB to the LSB to generate an n-bit digital signal, wherein, upon externally receiving a start signal, the SAR logic circuit generates a digital signal of a MSB having a one-bit phase delay compared with the start signal.

10 Claims, 6 Drawing Sheets

FIG. 1

Related Art

FIG. 2

Related Art

SUCCESSIVE APPROXIMATION REGISTER ANALOG-TO-DIGITAL CONVERTER AND ANALOG-TO-DIGITAL CONVERSION METHOD USING THE SAME

This application claims the benefit of Korean Patent Application No. 10-2010-0126553, filed on Dec. 10, 2010, and Korean Patent Application No. 10-2011-0119910, filed on Nov. 17, 2011, which are hereby incorporated by reference as if fully set forth herein.

BACKGROUND

1. Field of the Disclosure

The present disclosure relates to a Successive Approximation Register (SAR) Analog-to-Digital Converter (ADC), and more particularly, to an SAR ADC which can maintain an optimal operating time for resolution and improve stability by improving a response time, and an analog-to-digital conversion method using the same.

2. Discussion of the Related Art

An ADC is a device for converting an analog signal into a digital code. The ADC samples the analog signal and converts the sampled analog signal into a digital code or digital signal corresponding to magnitude of the sampled analog signal. Among ADCs, an SAR ADC including an SAR combines digital codes while sequentially increasing or decreasing from a significant bit and compares the combined digital code with an analog signal to approximate to the analog signal.

A typical SAR ADC includes an N-bit (where N is an integer equal to or greater than 1) Digital-to-Analog Converter (DAC) and a comparator. The N-bit DAC converts an N-bit digital code into a corresponding analog voltage. The comparator compares the analog voltage generated from the N-bit DAC with an input analog signal. If the input analog signal is greater than the analog voltage, the comparator generates a high level signal, i.e. a signal having a logic value of 1. If the analog voltage is greater than or equal to the input analog signal, the comparator generates a low level signal, i.e. a signal having a logic value of 0.

When setting a Most Significant Bit (MSB) of the digital code input to the N-bit DAC to a logic value of 1, and comparing the input analog signal with the analog voltage generated from the N-bit DAC, an MSB of an N-bit digital code can be determined. Next, the above-described comparison process is repeated while sequentially changing a subsequent bit of the digital code input to the N-bit DAC to determine the N-bit digital code corresponding to the analog signal.

Figure 1:
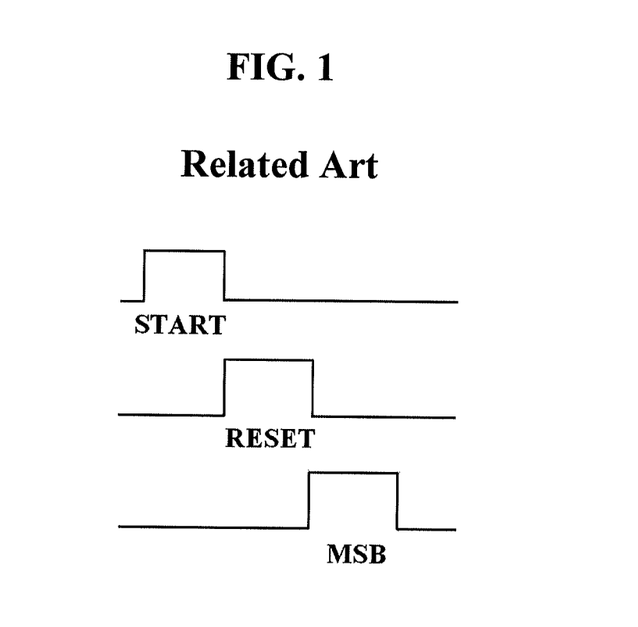
FIG. 1 is a driving waveform chart illustrating an operating method of the SAR logic circuit according to related art.

However, such a conventional SAR ADC includes a start stage and an inverting gate for resetting an SR flip-flop generating a digital signal of MSB. A start signal START is input to the start stage, and then a phase of the start signal START is inverted in the inversion gate via the start stage and thus inversion gate generates a reset signal RESET. When the reset signal RESET is input to the SR flip-flop, the SR flip-flop generates the digital signal of MSB. In this case, since the digital signal of the MSB has a 2-phase difference with the start signal START as shown in FIG. 1, an operating time is increased. Accordingly, it is difficult to operate the SAR during a time optimized for resolution, and in order to achieve the same operating time suitable for resolution, the SAR encounters problems such as fast supply of a clock period input to the SAR.

Figure 2:
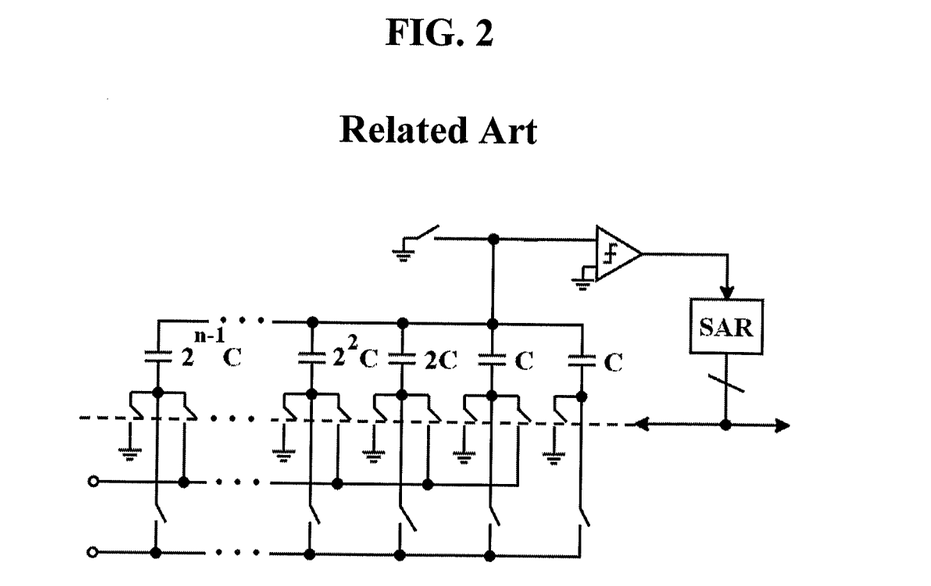
FIG. 2 is a circuit diagram illustrating a DAC according to related art.

Furthermore, the conventional DAC is comprised of binary weighted capacitors as shown in FIG. 2. The DAC comprised of the binary weighted capacitors has linearity higher than a resistor and facilitates low-power design. However, as resolution is increased, a ratio of capacitors having the largest size to capacitors having the smallest size is abruptly increased. For example, in the case of an 8-bit DAC, the size of a capacitor corresponding to the MSB is 128 times a minimum capacitor size. If a unit capacitor is used for matching characteristics, 256 capacitors are needed. Thus, if the size of a capacitor determined in consideration of matching is very large, a total area of the DAC is increased, thereby deteriorating integration and complicating a circuit.

SUMMARY

A Successive Approximation Register (SAR) Analog-to-Digital Converter (ADC) includes a Sample-and-Hold Amplifier (SHA) for sampling and holding an externally input analog voltage, a comparator for comparing a level of the sampled and held analog voltage with a level of an analog signal corresponding to n bits, wherein n is an integer no less than 1, and generating a comparison signal according to result of comparison, an SAR logic circuit for sequentially generating a digital signal from a Most significant Bit (MSB) to a Least Significant Bit (LSB) in response to the comparison signal, a Digital-to-Analog Converter (DAC) for converting the sequentially generated digital signal into the analog signal and providing the analog signal to the comparator, and an output register for holding the sequentially generated digital signal from the MSB to the LSB to generate an n-bit digital signal, wherein, upon externally receiving a start signal, the successive approximation register logic circuit generates a digital signal of a most significant bit having a one-bit phase delay compared with the start signal.

In another aspect of the present invention, an analog-to-digital conversion method using a Successive Approximation Register (SAR) Analog-to-Digital Converter (ADC), includes sampling and holding an externally input analog voltage, comparing a level of the sampled and held analog voltage with a level of an analog signal corresponding to n bits, wherein n is an integer no less than 1 and generating a comparison signal according to result of comparison, sequentially generating a digital signal from a Most Significant Bit (MSB) to a Least Significant Bit (LSB) in response to the comparison signal, converting the sequentially generated digital signal into the analog signal and generating the analog signal, and holding the sequentially generated digital signal from the MSB to the LSB to generate an n-bit digital signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EXEMPLARY EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

Figure 3:
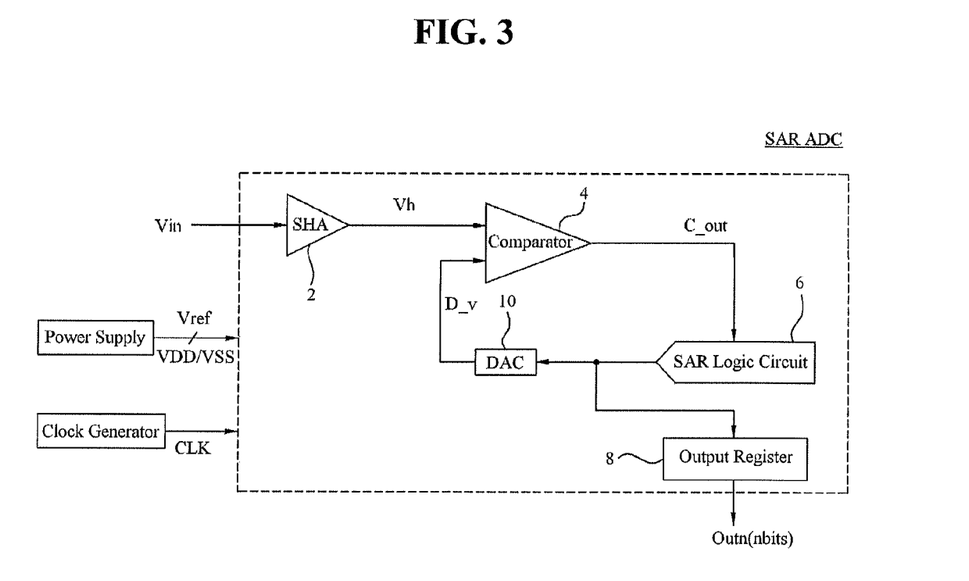
FIG. 3 is a block diagram illustrating an SAR ADC according to an exemplary embodiment of the present invention.

FIG. 3 is a block diagram illustrating an SAR ADC according to an exemplary embodiment of the present invention.

The SAR ADC of FIG. 3 includes a Sample-and-Hold Amplifier (SHA) 2 for sampling and holding an externally input analog voltage Vin, a comparator 4 for comparing a level of the sampled and held analog input voltage with a level of an analog output signal corresponding to n bits and generating a comparison signal C_out according to result of comparison, an SAR logic circuit 6 for sequentially generating a digital signal from an MSB to an LSB in response to the comparison signal C_out, a DAC 10 for converting the sequentially generated digital signal into the analog output signal corresponding to n bits and providing the analog output signal to the comparator 4, and an output register 8 for holding the sequentially generated digital signal from the MSB to the LSB to generate an n-bit digital signal Outn.

The SAR ADC constructed as described above may further include a power supply for generating driving voltages VDD and VSS necessary to drive constituent elements such as the SHA 2, the comparator 4, the output register 8, etc. and a reference voltage Vref supplied to the DAC 10, and a clock generator for supplying at least one clock signal CLK to the SAR logic circuit 6. Alternatively, the power supply and the clock generator may be separately constructed as shown in FIG. 3 such that the voltages VDD, VSS and Vref and at least one clock signal CLK are supplied to the SAR ADC.

The SHA 2 of the SAR ADC samples the externally input analog voltage Vin, holds and amplifies the sampled voltage so as not to distort the sampled voltage, and generates a sampled and held analog input voltage Vh. The SHA 2 is mainly used to sample and hold a high resolution analog graphic signal and includes at least one capacitor, an amplifying circuit, and a switching element.

The comparator 4 compares a level of the sampled and held analog input voltage Vh with a level of successively input analog signal corresponding to n bits and generates the comparison signal C_out of a high or low level according to result of comparison. Since a level of a first input analog signal corresponds to a level of a preset reference voltage Vref, it may be higher than the held analog voltage Vh. The comparator 4 generates the comparison signal C_out of a high or low level such that a level of an analog output signal D_v which is sequentially input in units of at least one bit is equal to a level of the held analog voltage Vh.

The SAR logic circuit 6 sequentially generates digital signal of n preset bits from an MSB to an LSB in response to the comparison signal C_out of a high or low level. Specifically, if a start signal is externally input, the SAR logic circuit 6 generates a digital signal of an MSB having a one-bit phase delay compared with the start signal in response to the clock signal CLK generated from the clock generator and the comparison signal C_out generated from the comparator 4. The generated digital signal of the MSB is supplied to the DAC 10. Next, the SAR logic circuit 6 generates a digital signal of a bit having a one-bit phase delay compared with the MSB in response to the clock signal CLK and the comparison signal C_out, which are input with a next phase delay. In this way, the SAR logic circuit 6 sequentially generates the digital signal of preset n bits from an MSB to an LSB in response to the clock signal CLK generated from the clock generator and the comparison signal C_out of a high or low level generated in units of at least one bit from the comparator 4. The SAR logic circuit 6 will be described in detail later.

The DAC 10 converts the digital signal which is sequentially input from the SAR logic circuit 6 in units of at least one bit into the analog output signal D_v corresponding to n bits. The DAC 10 may be a small-scale c-2c ladder type DAC having a simplified circuit configuration. In the DAC 10, at least one switching element and a first capacitor, which are serially connected to each other are connected in parallel to a connection node between a plurality of second capacitors which are serially connected to each other. The DAC 10 generates the analog output signal D_v corresponding to n bits by supplying the ground voltage VSS or the reference voltage Vref to the connection nodes between the second capacitors according to the digital signal which is sequentially input in units of at least one bit from the SAR logic circuit 6.

As described above, a level of the analog output signal D_v corresponding to n bits varies according to the digital signal sequentially input from the SAR logic circuit 6. Accordingly, the comparator 4 generates the comparison signal C_out according to a result of comparing a level of the sequentially input analog output signal D_v corresponding to n bits with a level of the held analog input voltage Vh, thereby causing the SAR logic circuit 6 to sequentially generate subsequent bits of the digital signal. Then, a process is repeated in which the DAC 10 generates the analog output signal D_v corresponding to n bits again according to the sequentially generated subsequent bits and the comparator 4 compares input signal levels. As a result, the n-bit digital signal corresponding to the held analog input voltage Vh is determined.

The output register 8 sequentially holds the digital signal generated through the SAR logic circuit 6 from the MSB to the LSB to generate the n-bit digital signal Outn.

Figure 4:
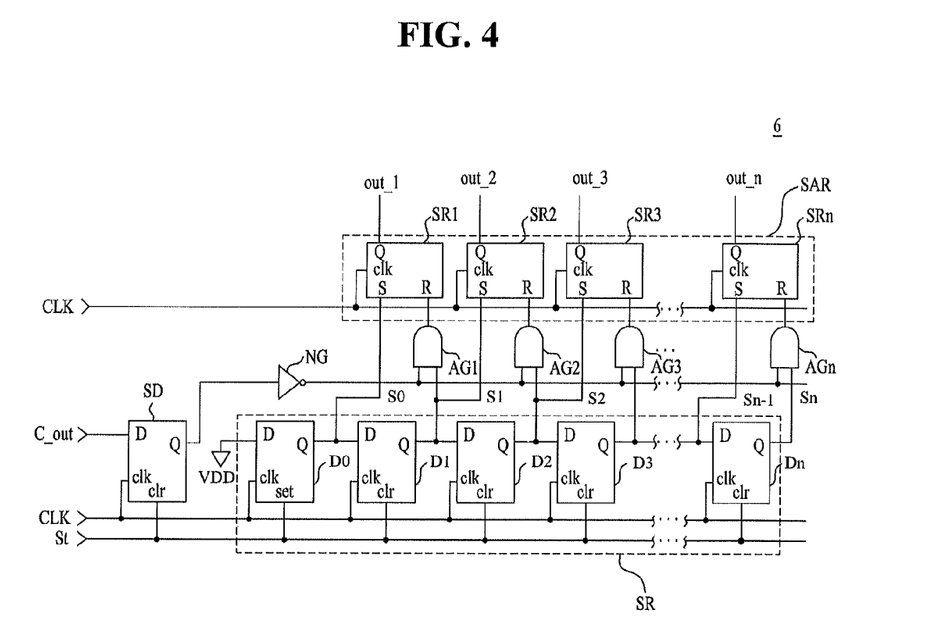
FIG. 4 is a block diagram illustrating an SAR logic circuit shown in FIG. 3.

FIG. 4 is a block diagram illustrating the SAR logic circuit 6 shown in FIG. 3.

The SAR logic circuit 6 includes a start stage SD for receiving the comparison signal C_out from the comparator 4 and synchronizing the comparison signal C_out with an externally input clock signal CLK, a shift register SR which includes a plurality of stages D0 to Dn and sequentially generates shift pulses S0 to Sn according to a start signal St and the clock signal CLK, a plurality of logic gates AG1 to AGn for sequentially generating logic signals in response to the comparison signal C_out sequentially generated through the start stage SD and the shift pulses S0 to Sn, and an SAR for sequentially receiving the shift pulses S0 to Sn and the logic signals and sequentially generating an n-bit digital signal outn from an MSB to an LSB.

The start stage SD may be comprised of at least one D flip-flop. The start stage SD synchronizes the comparison signal C_out which is sequentially input in units of at least one bit with a clock signal CLK which is externally input and sequentially generates the comparison signal in units of at least one-bit cycle.

The shift register SR includes a plurality of cascade-connected stages D0 to Dn and sequentially generates the shift pulses S0 to Sn according to the externally input start signal St and the sequentially input clock signal CLK. Each of the plurality of stages D0 to Dn may be comprised of a D flip-flop. The D flip-flops are cascade-connected to each other. If the start signal St is input, the D flip-flops sequentially shift the start signal St according to the successively supplied clock signal CLK and generate the plurality of shift pulses S0 to Sn.

Each of the plurality of logic gates AG1 to AGn may be an AND gate. An inverting gate NG may be connected to an output terminal of the comparison signal C_out of the start stage SD to invert a phase of the comparison signal C_out. The plurality of logic gates AG1 to AGn comprised of AND gates sequentially generate logical product signals in response to the sequentially input phase-inverted comparison signal C_out sequentially generated through the start stage SD and the shift pulses S0 to Sn.

The SAR includes first to n-th shift register flip-flops SR1 to SRn, which are simultaneously receive the clock signal CLK. The first to n-th shift register flip-flops SR1 to SRn are connected to correspond to respective output terminals of the stages D0 to Dn of the shift register SR and receive the corresponding shift pulses S0 to Sn through respective first input terminals S. The first to n-th shift register flip-flops SR1 to SRn are also connected to correspond to respective output terminals of the plurality of logic gates AG1 to AGn and receive corresponding logic signals through respective second input terminals R. The first to n-th shift register flip-flops SR1 to SRn sequentially generate the n-bit digital signal outn from an MSB to an LSB according to the sequentially input shift pulses S0 to Sn−1 and logic signals in response to the successively supplied clock signal CLK.

Figure 5:
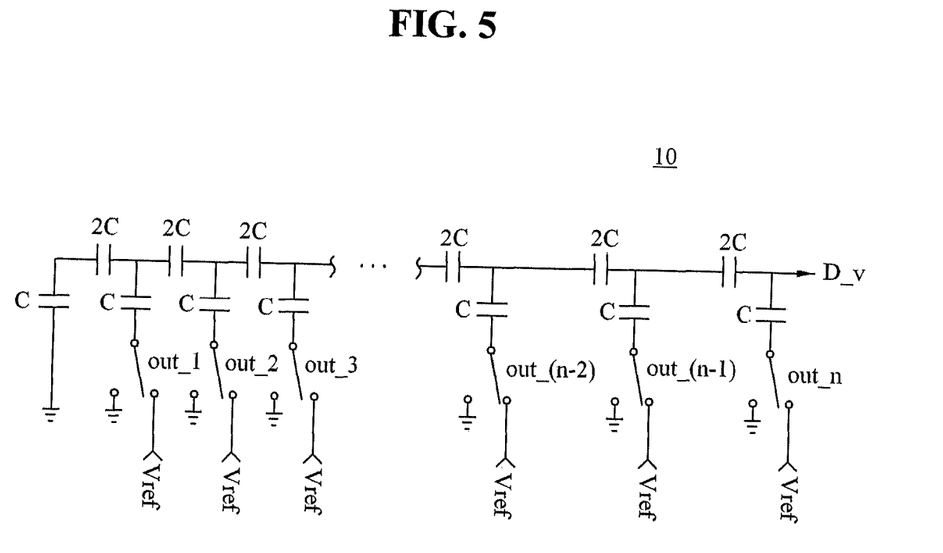
FIG. 5 is a circuit diagram illustrating a DAC shown in FIG. 3.

FIG. 5 is a circuit diagram illustrating the DAC 10 shown in FIG. 3.

The DAC 10 of FIG. 5 has the structure of a c-2c ladder type. In the DAC 10, at least one switching element and a first capacitor C, which are serially connected to each other are connected in parallel to a connection node between a plurality of second capacitors 2C which are serially connected to each other.

The DAC 10 of the present invention can reduce a total area thereof since a capacitance of the largest capacitor is relatively less than that of the conventional DAC comprised of binary weighted capacitors.

The DAC 10 generates the analog output signal D_v corresponding to n bits, a voltage level of which varies according to bit signals out_1 to out_n which are sequentially input in units of at least one bit from the SAR logic circuit 6. Namely, the DAC 10 of the c-2c ladder type causes the ground voltage VSS or the reference voltage Vref to be supplied to connection nodes between the second capacitors 2C according to the bit signals out_1 to out_n which are sequentially input from the SAR logic circuit 6 in units of at least one bit, thereby generating the analog output signal D_v corresponding to n bits and supplying the analog output signal D_v corresponding to n bits to the comparator 4.

Figure 6:
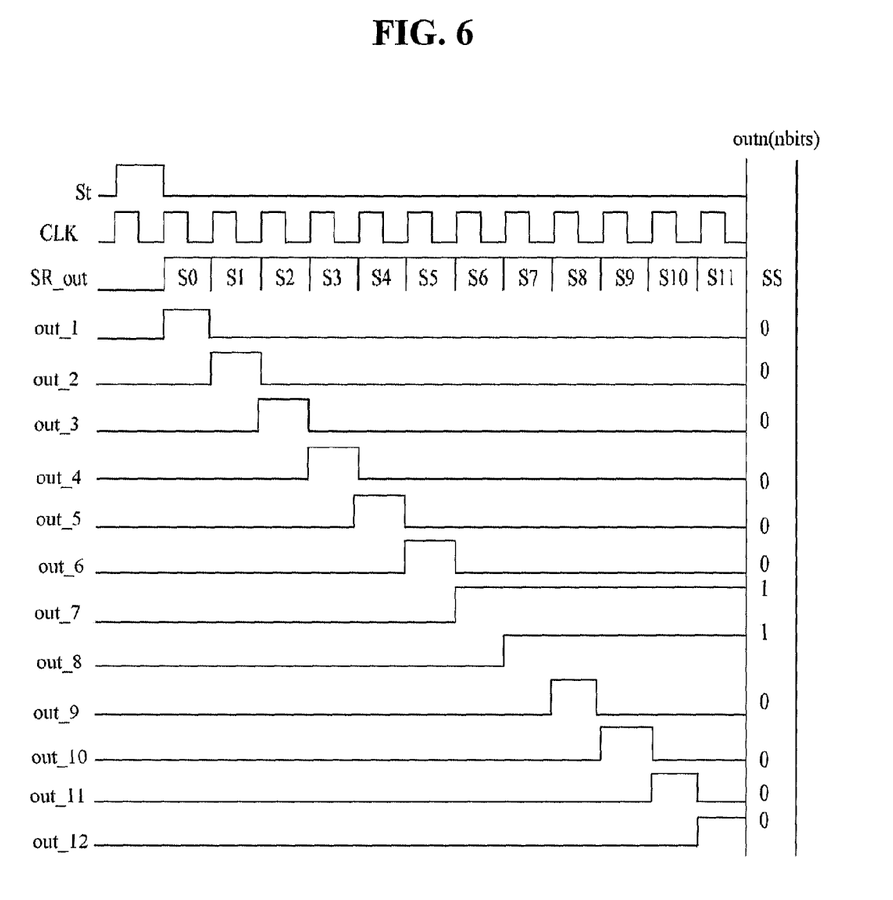
FIG. 6 is a driving waveform chart illustrating an operating method of the SAR logic circuit shown in FIG. 4.
Figure 7:
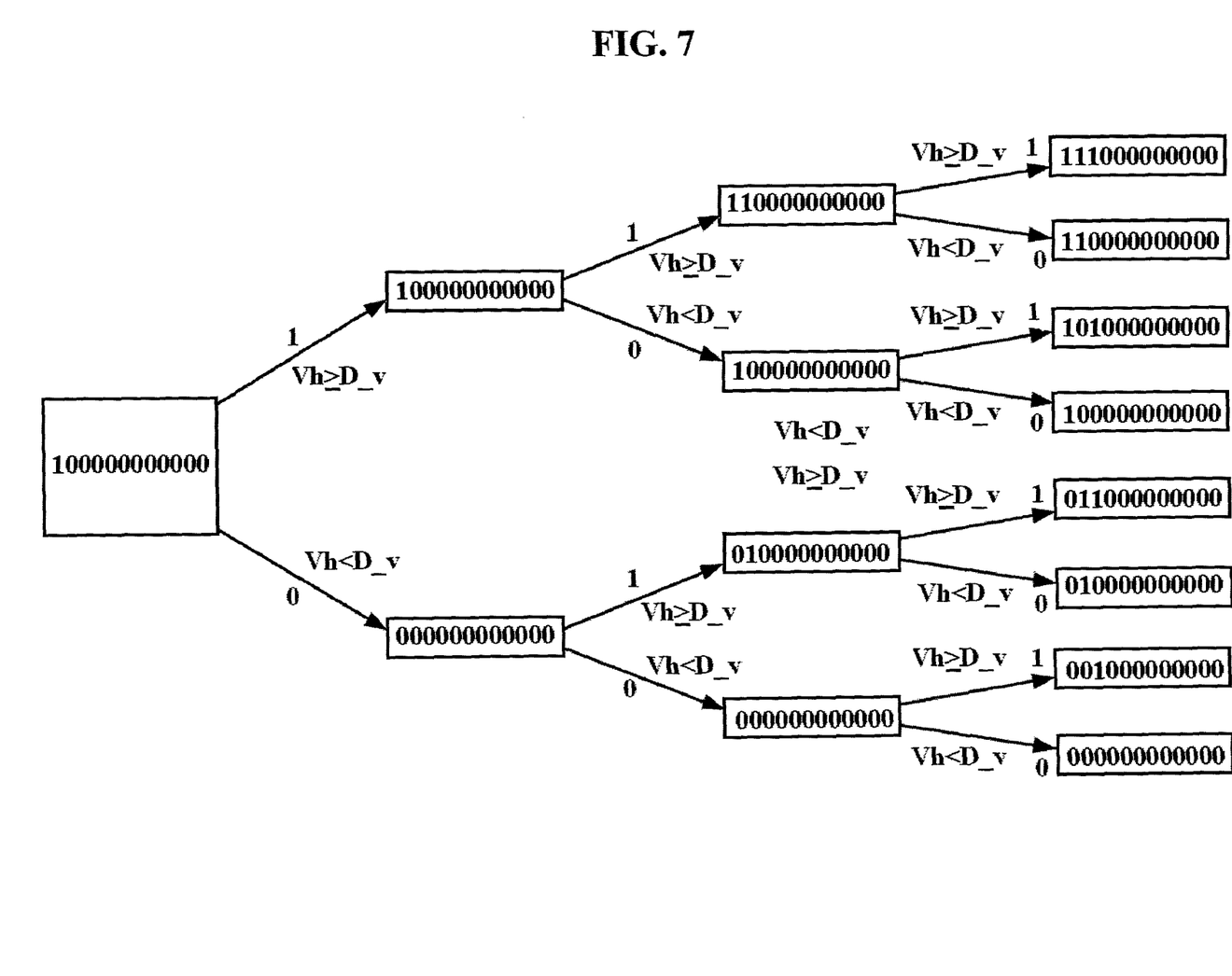
FIG. 7 is a diagram explaining an operating method of the SAR logic circuit shown in FIG. 4.

FIG. 6 is a driving waveform chart explaining an operating method of the SAR logic circuit shown in FIG. 4. FIG. 7 is a diagram explaining an operating method of the SAR logic circuit shown in FIG. 4. In FIGS. 6 and 7, a 12-bit SAR DAC will be described as an example, and in FIG. 7, a conversion process of three MSBs starting from $12^{th}$ bit will be described.

Referring to FIGS. 4, 6 and 7, when the start signal St is input to the first stage D0 of the shift register SR included in the SAR logic circuit 6, the first stage D0 is set by the set voltage VDD supplied to a D input terminal of the first stage D0. The set first stage D0 supplies the first shift pulse S0 of high logic corresponding to the set voltage to the first SR flip-flop SR1 of the SAR. Then the first SR flip-flop SR1 of the SAR generates a digital signal of an MSB of "1" in synchronization with the first shift pulse S0 and the other SR flip-flops SR2, SR3 . . . SRn generate digital signals out_2, out_3 . . . out_n of "0". Namely, the SAR is initialized as a digital signal of 100000000000. In this case, the digital signal out_1 of the MSB has a one-phase difference with the start signal St, as shown in FIG. 6. Thus, since the digital signal out_1 of the MSB and the start signal St have one-phase difference, the present invention can reduce an operating time as compared with the conventional technique having 2-phase difference between the digital signal out_1 of the MSB and the start signal St.

Next, the digital signal of 100000000000 generated from the SAR is supplied to the DAC 10 and the DAC 10 converts the digital signal into the analog output voltage D_v. The analog output voltage D_v is compared by the comparator 4 with the analog input signal Vh sampled and held in the SHA 2.

As a comparison result, when the analog input signal Vh is greater than or equal to the analog output signal D_v, the comparator 4 generates the comparison signal C_out of a high level. A phase of the comparison signal C_out of the high level is inverted in the inversion gate NG via the start stage SD and the comparison signal C_out is converted into a comparison signal of a low level. When the comparison signal of the low level is input to the AND gate AG, the AND gate AG generates a low level and thus the first SR flip-flop SR1 maintains the digital signal out_1 of the bit of "1". That is, the SAR generates a digital signal of 100000000000 through one feedback process.

Meanwhile, as a comparison result, when the analog input signal Vh is less than the analog output signal D_v, the comparator 4 generates the comparison signal C_out of a low level. A phase of the comparison signal C_out of the low level is inverted in the inversion gate NG via the start stage SD and the comparison signal C_out is converted into a comparison signal of a high level. The comparison signal of the high level is converted into the high level by the AND gate AG and is supplied to the S terminal of the first SR flip-flop. The first SR flip-flop SR1 is reset to generate an MSB having a value of "0". That is, the SAR generates a digital signal of 000000000000 through one feedback process.

Next, the shift pulse of the first stage D0 is shifted to the D input terminal of the second stage D1 in synchronization with the clock signal CLK. Then the second SR flip-flop SR2 of the SAR generates a digital signal out_2 having a bit of "1" in synchronization with the shift pulse S1 and the other SR flip-flops generate digital signals out_3, out_4, . . . , out_n having an bit of "0". Namely, the SAR generates a digital signal of is initialized as a digital signal of [110000000000] or [010000000000].

The DAC 10 converts the digital signal of [110000000000] or [010000000000] into the analog output voltage D_v. The analog output voltage D_v is compared by the comparator 4 with the analog input signal Vh of the SHA 2.

As a comparison result, when the analog input signal Vh is greater than or equal to the analog output signal D_v, the comparator 4 generates the comparison signal C_out of a high level. A phase of the comparison signal C_out of the high level is inverted in the inversion gate NG via the start stage SD and the comparison signal C_out is converted into a comparison signal of a low level. The comparison signal of the low level is input to the AND gate AG2. The AND gate AG2 generates a low level and thus the second SR flip-flop SR2 maintains the digital signal of the bit of "1". That is, the SAR generates a digital signal of 110000000000 or 010000000000.

Meanwhile, as a comparison result, when the analog input signal Vh is less than the analog output signal D_v, the comparator 4 generates the comparison signal C_out of a low level. A phase of the comparison signal C_out of the low level is inverted in the inversion gate NG via the start stage SD and the comparison signal C_out is converted into a comparison signal of a high level. The comparison signal of the high level is converted into the high level by the AND gate AG2 and the second SR flip-flop SR2 is reset to generate a digital signal of a bit of "0". That is, the SAR generates a digital signal of 100000000000 or 000000000000.

In this way, the SAR logic circuit 6 sequentially generates a digital signal of preset n bits from an MSB to an LSB, in response to the clock signal which is sequentially input from the clock generator and the comparison signal C_out of a high or low level which is input from the comparator 4 in units of at least one bit. The DAC 10 converts the digital signal which is sequentially input from the SAR logic circuit 6 in units of at least one bit into the analog output signal D_v corresponding to n bits.

Figure 8:
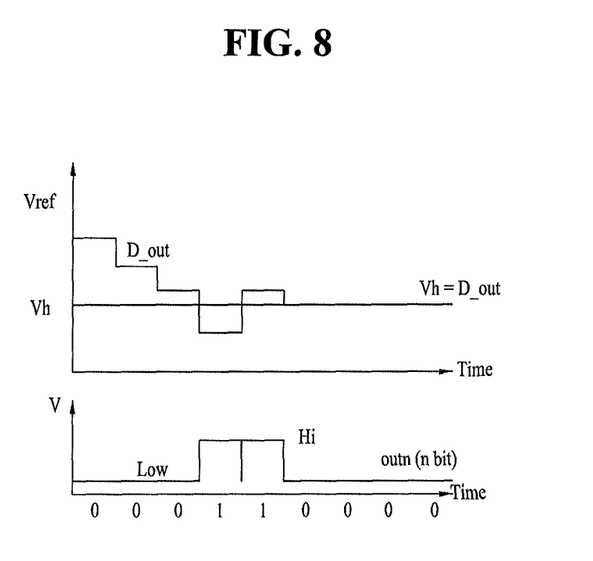
FIG. 8 is a diagram illustrating an n-bit digital signal determination method of the SAR ADC of FIG. 3.

FIG. 8 is a diagram illustrating an n-bit digital signal determination method of the SAR ADC of FIG. 3.

Referring to FIGS. 6 and 8, a level of the analog output signal D_v corresponding to n bits generated in units of at least one bit through the DAC 10 varies according to the sequentially input digital signal outn of the SAR. The comparator 4 compares a level of the sequentially input analog output signal D_v corresponding to n bits with a level of the held analog input voltage Vh and sequentially generates the comparison signal C_out. The SAR logic circuit 6 sequentially generates subsequent bits of a digital signal in response to the sequentially generated comparison signal C_out. The DAC 10 generates the analog output signal D_v corresponding to n bits in response to the sequentially generated subsequent bits, and the comparator 4 compares input signal levels, thereby determining the n-bit digital signal outn corresponding to a level of the held analog input voltage Vh. The output register 8 sequentially holds digital signal from an MSB to an LSB sequentially generated through the SAR logic circuit 6 to generate the n-bit digital signal Outn.

The SAR ADC having the above-described features and the analog-to-digital conversion method using the same according to an exemplary embodiment of the present invention can maintain an optimal operating time for resolution by generating the n-bit digital signal outn only during an operating time necessary for processing n bits without an additional operating time. Further, the SAR ADC is formed by a differential motion structure having a simplified circuit configuration using a small-size c-2c ladder type DAC, thereby reducing the influence of noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A successive approximation register analog-to-digital converter comprising:
   a sample-and-hold amplifier that samples and holds an externally input analog voltage;
   a comparator that compares a level of the sampled and held analog voltage with a level of an analog signal corresponding to n bits and generating a comparison signal according to result of comparison, wherein n is an integer no less than 1;
   a successive approximation register logic circuit that sequentially generates a digital signal from a most significant bit to a least significant bit in response to the comparison signal;
   a digital-to-analog converter that converts the sequentially generated digital signal into the analog signal and providing the analog signal to the comparator; and
   an output register for holding the sequentially generated digital signal from the most significant bit to the least significant bit to generate an n-bit digital signal;
   wherein, upon externally receiving a start signal, the successive approximation register logic circuit generates a digital signal of a most significant bit having a one-bit phase delay compared with the start signal.

2. The successive approximation register analog-to-digital converter of claim 1, wherein the successive approximation register logic circuit includes:
   a start stage that receives the comparison signal and synchronizing the comparison signal with the clock signal;
   a shift register including (n+1) cascade-connected stages and sequentially generating a $1^{st}$ to $(n+1)^{th}$ shift pulses according to the start signal and the clock signal;
   n logic gates that sequentially generate n logic signals in response to the comparison signal sequentially generated through the start stage and the $2^{nd}$ to $(n+1)^{th}$ shift pulses; and
   a successive approximation register that sequentially receives the $1^{st}$ to $n^{th}$ shift pulses and the n logic signals and sequentially generates the n-bit digital signal from the most significant bit to the least significant bit.

3. The successive approximation register analog-to-digital converter of claim 1, wherein the digital-to-analog converter has a c-2c ladder type structure and has a configuration in which at least one switching element and a first capacitor which are serially connected to each other are connected to a connection node between a plurality of second capacitors which are serially connected to each other so as to be parallel to the second capacitors so as to be parallel to the second capacitors.

4. The successive approximation register analog-to-digital converter of claim 2, wherein the n logic gates are n AND gates for sequentially generating n logic product signals in response to the comparison signal sequentially generated through the start stage and the $2^{nd}$ to $(n+1)^{th}$ shift pulses.

5. The successive approximation register analog-to-digital converter of claim 4, wherein a first stage of the (n+1) cascade-connected stages included in the shift register is a D flip-flop having an input terminal to which a set voltage is supplied,
   wherein the first stage supplies a first shift pulse among the plurality of shift pulses corresponding to the set voltage to a first shift register flip-flop of the successive approximation register in response to the start signal, and
   wherein the first shift register flip-flop generates the digital signal of the most significant bit having a one-bit phase delay compared with the start signal in synchronization with the first shift pulse.

6. An analog-to-digital conversion method using a successive approximation register analog-to-digital converter, comprising:
   sampling and holding an externally input analog voltage;
   comparing a level of the sampled and held analog voltage with a level of an analog signal corresponding to n bits and generating a comparison signal according to the result of comparison, wherein n is an integer no less than 1;

sequentially generating a digital signal from a most significant bit to a least significant bit in response to the comparison signal;

converting the sequentially generated digital signal into the analog signal; and holding the sequentially generated digital signal from the most significant bit to the least significant bit to generate an n-bit digital signal, wherein the sequentially generating a digital signal includes, upon externally receiving a start signal, generating a digital signal of a most significant bit having a one-bit phase delay compared with the start signal.

7. The analog-to-digital conversion method of claim 6, wherein the sequentially generating a digital signal includes:

receiving the comparison signal and synchronizing the comparison signal with the clock signal;

sequentially generating $1^{st}$ to $(n+1)^{th}$ shift pulses according to a start signal received externally and the clock signal;

sequentially generating n logic signals in response to the synchronized comparison signal and the $2^{nd}$ to $(n+1)^{th}$ shift pulses; and sequentially receiving the $1^{st}$ to $n^{th}$ shift pulses and the n logic signals and sequentially generating the n-bit digital signal from a most significant bit to a least significant bit.

8. The analog-to-digital conversion method of claim 7, wherein the converting the sequentially generated digital signal into the analog signal uses a digital-to-analog converter of a c-2c ladder type structure in which at least one switching element and a first capacitor which are serially connected to each other are connected to a connection node between a plurality of second capacitors which are serially connected to each other so as to be in parallel to the second capacitors.

9. The analog-to-digital conversion method of claim 8, wherein sequentially generating n logic signals includes sequentially generating n logic product signals in response to the synchronized comparison signal and the $2^{nd}$ to $(n+1)^{th}$ shift pulses.

10. The analog-to-digital conversion method of claim 9, wherein the generating a digital signal of the most significant bit having the one-bit phase delay compared with the start signal includes:

supplying a set voltage to a first stage of the plurality of cascade-connected stages included in the shift register, wherein the first stage is a D flip-flop;

supplying a first shift pulse corresponding to the set voltage to the first stage in response to the start signal; and generating the digital signal of the most significant bit having a one-bit phase delay compared with the start signal in synchronization with the first shift pulse.

* * * * *